US011801850B2

United States Patent
Lueckel et al.

(10) Patent No.: US 11,801,850 B2
(45) Date of Patent: Oct. 31, 2023

(54) METHOD FOR SYNCHRONIZING SIGNALS

(71) Applicant: Robert Bosch GmbH, Stuttgart (DE)

(72) Inventors: Patrick Lueckel, Stuttgart (DE); Juergen Motz, Steinheim An der Murr (DE); Quang-Minh Le, Hemmingen (DE)

(73) Assignee: Robert Bosch GmbH, Stuttgart (DE)

( * ) Notice: Subject to any disclaimer, the term of this patent is extended or adjusted under 35 U.S.C. 154(b) by 81 days.

(21) Appl. No.: 17/423,661

(22) PCT Filed: Jan. 30, 2020

(86) PCT No.: PCT/EP2020/052302
§ 371 (c)(1),
(2) Date: Jul. 16, 2021

(87) PCT Pub. No.: WO2020/207635
PCT Pub. Date: Oct. 15, 2020

(65) Prior Publication Data
US 2022/0073087 A1 Mar. 10, 2022

(30) Foreign Application Priority Data
Apr. 12, 2019 (DE) .......................... 102019205326.2

(51) Int. Cl.
*B60W 50/06* (2006.01)
(52) U.S. Cl.
CPC .................................. *B60W 50/06* (2013.01)
(58) Field of Classification Search
CPC .................................................... B60W 50/06
See application file for complete search history.

(56) References Cited

U.S. PATENT DOCUMENTS

| 3,886,494 A | * | 5/1975 | Kostelnicek | G01V 1/223 367/77 |
| 5,218,486 A | * | 6/1993 | Wilkinson | G11B 20/225 |
| 5,606,503 A | * | 2/1997 | Shal | B60G 17/016 280/124.108 |

(Continued)

FOREIGN PATENT DOCUMENTS

| WO | 03053019 A2 | 6/2003 |
| WO | 2020020548 A1 | 1/2020 |

OTHER PUBLICATIONS

Mosallaei et al., "Process Fault Detection and Diagnosis by Synchronous and Asynchronous Decentralized Kalman Filtering Using State-Vector Fusion Technique," 2007, 3rd International Conference on Intelligent Sensors, Sensor Networks and Information, IEEE, 2007, pp. 209-214. (Year: 2007).*

(Continued)

*Primary Examiner* — Yazan A Soofi
*Assistant Examiner* — Naeem Taslim Alam
(74) *Attorney, Agent, or Firm* — NORTON ROSE FULBRIGHT US LLP; Gerard Messina

(57) ABSTRACT

A method for synchronizing signals of a plurality of participants. A relationship between the signals is given by a physical relation. The signals are each filtered with a first filter in order to determine a shift between the signals. The determined shift is a measure of the phase shift between the signals. The shift is subsequently eliminated by filtering the signals respectively with a second filter.

11 Claims, 3 Drawing Sheets

(56) References Cited

U.S. PATENT DOCUMENTS

| | | | | |
|---|---|---|---|---|
| 6,321,246 | B1* | 11/2001 | Page | H03H 17/08 |
| | | | | 708/316 |
| 6,574,535 | B1* | 6/2003 | Morris | B60K 6/44 |
| | | | | 180/65.6 |
| 9,460,007 | B1* | 10/2016 | Wu | G06F 15/7867 |
| 9,787,825 | B1* | 10/2017 | Ayrapetian | H04M 3/002 |
| 10,586,177 | B1* | 3/2020 | Choueiter | G06N 3/044 |
| 2008/0051950 | A1* | 2/2008 | Seo | B60L 15/025 |
| | | | | 903/903 |
| 2010/0012087 | A1* | 1/2010 | Tseng | F02P 5/151 |
| | | | | 123/406.12 |
| 2010/0087996 | A1* | 4/2010 | Haggerty | B60W 10/08 |
| | | | | 903/945 |
| 2011/0268459 | A1 | 11/2011 | Rollins et al. | |
| 2011/0274210 | A1* | 11/2011 | Chekhovstov | H03F 1/3247 |
| | | | | 375/297 |
| 2012/0053800 | A1* | 3/2012 | Kieliszewski | F16H 59/72 |
| | | | | 701/60 |
| 2012/0084062 | A1* | 4/2012 | Maturana | G06F 30/33 |
| | | | | 703/6 |
| 2013/0342255 | A1* | 12/2013 | Satsukawa | H03K 5/14 |
| | | | | 327/276 |
| 2014/0133528 | A1* | 5/2014 | Noest | H03C 5/00 |
| | | | | 375/219 |
| 2015/0281546 | A1* | 10/2015 | Okada | H04N 23/745 |
| | | | | 348/226.1 |
| 2016/0029966 | A1* | 2/2016 | Salas-Boni | A61B 5/02055 |
| | | | | 600/347 |
| 2016/0059735 | A1* | 3/2016 | Vovos | B60L 50/62 |
| | | | | 701/22 |
| 2017/0085405 | A1* | 3/2017 | Xu | H04L 27/2272 |
| 2017/0334448 | A1* | 11/2017 | Schwunk | B60W 10/08 |
| 2018/0009430 | A1* | 1/2018 | Chung | B60K 6/48 |
| 2020/0075033 | A1* | 3/2020 | Hijazi | G06N 3/086 |
| 2020/0103267 | A1* | 4/2020 | Abbas | B60K 35/00 |
| 2020/0227073 | A1* | 7/2020 | Reed | G10L 21/0224 |
| 2020/0232859 | A1* | 7/2020 | Farshizadeh | G01L 3/10 |
| 2022/0182090 | A1* | 6/2022 | Imamura | H04B 1/10 |

OTHER PUBLICATIONS

International Search Report for PCT/EP2020/052302, dated Apr. 30, 2020.

Mosallaei et al., "Process Fault Detection and Diagnosis by Synchronous and Asynchronous Decentralized Kalman Filtering Using State-Vector Fusion Technique," 2007 3rd International Conference on Intelligent Sensors, Sensor Networks and Information, IEEE, 2007, pp. 209-214.

* cited by examiner

METHOD FOR SYNCHRONIZING SIGNALS

FIELD

The present invention relates to a method for synchronizing signals and to a system for carrying out the method.

BACKGROUND INFORMATION

In signal processing, in many cases, such as in a sensor fusion, the task arises of combining asynchronous signals. This frequently occurs in decentralized systems, for example in the onboard electrical network of vehicles, in which measurement signals of a plurality of sensors are to be processed. Thus, for example methods for sensor fusion and measurement error calibration presuppose synchronous measurement data. In this context, synchronous means that the starting time of the measurement is the same for all measured variables. In decentralized systems, such as the onboard energy network, this is however not the case. Rather, in the onboard energy network, the measurements are divided among a plurality of subcomponents that each use internal independent clocks. In addition, the transmission of signals between the components further results in latency times that further increase the asynchronicity. For this reason, calculation results that are based on different signal sources are strongly influenced by the asynchronicity of the signals.

The problem of asynchronicity is currently solved using various methods:
1. The use of a global clock used for synchronization.
2. Correlation of two signals in order to determine the asynchronicity via the similarity of the signals.
3. Transmission of a synchronization signal via bus systems in order to enable the calibration of internal clocks.
4. A trigger line that connects all sensors in the system in order to enable specification of a synchronous measurement start.

The methods described in the related art have a series of disadvantages. Thus, the methods named under 1. and 4. are in most cases cost-intensive. The method of 2. has proven to be computationally expensive. The method named under 3. requires valuable resources in the overall system.

SUMMARY

Against this background, a method, and a system are provided. In addition, a computer program and a machine-readable storage medium are provided. Specific embodiments result from the disclosure herein.

A method in accordance with an example embodiment of the present invention is used to synchronize signals of a plurality of participants, a relationship between the signals being given via a mathematical relation, realized as a physical relation, the signals each being filtered with a first filter in order to determine a shift between the signals, the determined shift being a measure of the phase shift between the signals. Subsequently, the shift is eliminated by filtering each of the signals with a second filter. In the method, the symmetry of the first filter and of the second filter is used to determine and to eliminate both a positive and a negative shift. In addition, in this way an equal damping of all signals is enabled.

The example method may be used for example in the context of a parameter determination, for example a cable harness diagnosis, in which a parameter is to be determined on the basis of input variables and/or measured variables. These input or measured variables are represented by signals that in turn are not synchronous with one another. Using the presented method, it is then possible first to synchronize the signals and then, in the embodiment, to determine or to estimate the parameter or parameters on the basis of the synchronized signals.

In accordance with an example embodiment of the present invention, in the method, it is provided that the signals of a plurality of, for example two, subscribers are each filtered with a filter in order to determine a temporal shift between the signals of the participants. With the aid of the determined shift, the signals of the participants of a decentralized system can be synchronized. For the synchronization of the signals of the participants, a mathematical relation between the signals must be given. A mathematical relation can be represented in the form of an equation, e.g., $U=R*I$.

Due to the use of digital filters, the synchronization design does not require any additional hardware that would result in costs. In branches in which these costs are of great importance, this advantage has a high potential for cost savings. In addition, the filters used may be simple digital (FIR) filters, so that few computing operations have to be carried out, and the existing system is not additionally loaded.

A FIR (finite impulse response) filter is a discrete, digitally implemented filter having a finite impulse response, also referred to as a transversal filter, and preferably used in the area of digital signal processing.

Likewise, in the method of the present invention no additional resources of the overall system are required; i.e., there is for example no handshake, and no additional messages via the bus system are required, so that as a result the scalability of the system is not limited.

It is in particular provided that all signals are filtered so that the damping of the filter acts on all signals, which has a positive effect in a quotient formation, because in this case the damping is trimmed out and thus eliminated. It also makes it possible for the method to estimate positive and negative delays, which enables a wide range of use of the synchronization design. These two effects are enabled by the symmetry of the filter.

In general, in the method, fractional delay filters can be used to compensate the transmission characteristic. For this purpose, for example Lagrange filters, or also other filters of any order are possible. To determine the delays, parameter estimation methods may be used, for example an extended Kalman filter (EKF).

The example method enables the synchronization of arbitrarily many mathematically coupled signals of two or more participants. Here, optionally a compensation can take place via bias parameters in the EKF, which improves the estimation quality of the delay. In addition, a monitoring of the bias parameters can take place for plausibilization purposes.

A possible application of the method in accordance with the present invention is in the area of cable harness diagnosis. In addition, the method can be used in many ways in the area of measurement data fusion.

A system in accordance with an example embodiment of the present invention is used to carry out the method. This system is implemented in hardware and/or in software. The system can be integrated in a control device of a vehicle, or can be fashioned independently.

In addition, a computer program is provided that includes program code for carrying out the steps of the example method. This computer program can be stored on a machine-readable storage medium.

Further advantages and embodiments of the present invention result from the description herein and the figures.

Of course, the features named above and explained in the following may be used not only in the respectively indicated combination, but also in other combinations, or by themselves, without departing from the scope of the present invention.

DETAILED DESCRIPTION OF EXAMPLE EMBODIMENTS

In the following, the problem with the asynchronicity of two signals is explained for the case of application of an onboard electrical network of a motor vehicle. It is to be kept in mind that the presented method is not limited to this case of application, but rather can be used whenever two asynchronous signals are to be synchronized.

Figure 1:
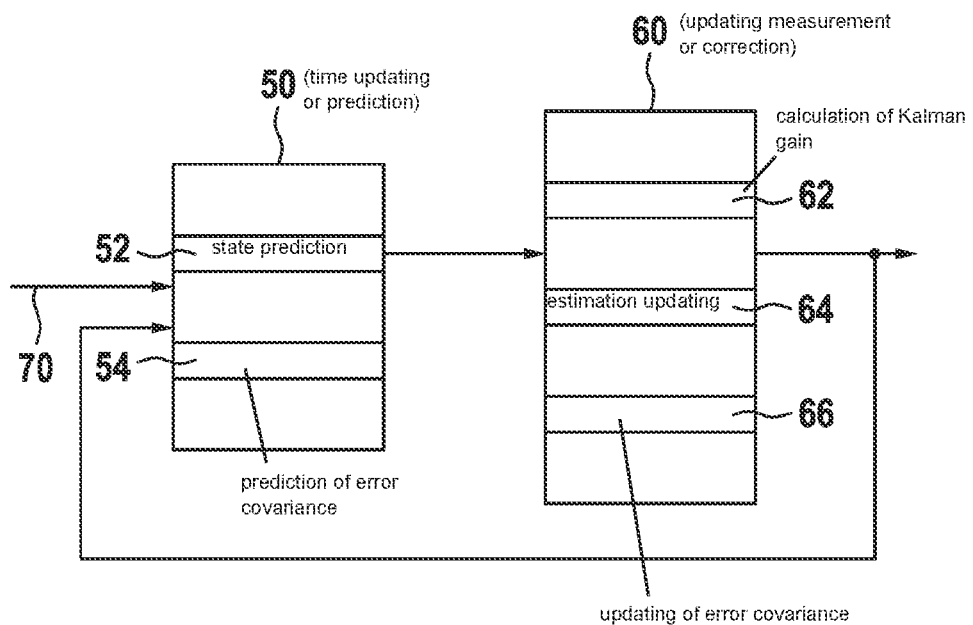
FIG. 1 shows, in a diagram, a method for estimating parameters in accordance with an example embodiment of the present invention.

FIG. 1 shows, in a diagram, a method for estimating parameters. The illustration shows a first block 50 for time updating or prediction, having a state prediction 52 and a prediction 54 of the error covariance, as well as a second block 60 for updating the measurement, or correction, having a calculation 62 of the Kalman gain, an estimation updating 64 with measurement and an updating 66 of the error covariance. An initial estimation is provided at input 70.

Figure 2:
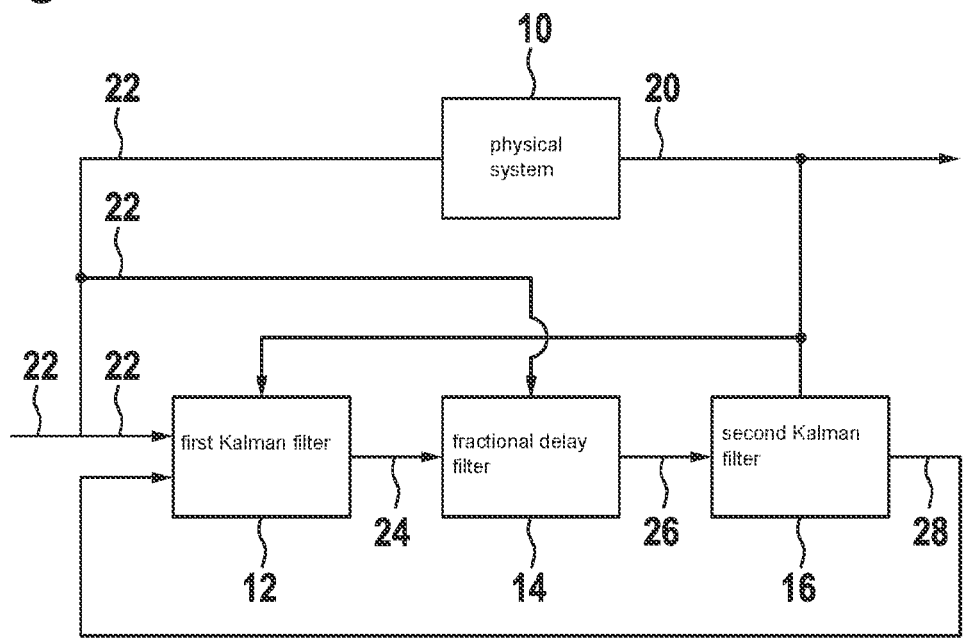
FIG. 2 shows an example embodiment of the method of the present invention.

FIG. 2 shows, in a diagram, a possible embodiment of the presented method. The representation shows a physical system 10, a first Kalman filter 12 for estimating the delay, a fractional delay filter 14 for synchronizing the input and measurement variables, and a second Kalman filter 16 for estimating the parameters of physical system 10. Measurement variables z(k) 20 and input variables u(k) 22 are coupled to one another via physical system 10. Physical system 10 is given for example by the equation U=R*I, where the voltage U is the measured variable z(k) and the current I is the input variable u(k). The physical coupling of these two variables is provided via the resistor R.

Input variables u(k) go into physical system 10, first Kalman filter 12, and fractional delay filter 14. First Kalman filter 12 outputs a shift, or delay, D 24. Fractional delay filter 14 outputs $u(k+D/2*t_s)$, $z(k-D/2*t_s)$ 26, which represent the synchronized input and measured variables. Second Kalman filter 16 outputs estimated parameters 28 of physical system 12.

As already stated, in an onboard electrical or energy network of a vehicle diagnostic results are strongly influenced by the asynchronicity of the measured variables. If the asynchronicity can be determined and eliminated, this has a positive effect on the result of the diagnosis. The diagnostic design is based on time-discrete measured variables that have the same sampling rate but have a temporal shift relative to one another, the temporal shift being $D*t_s$. Here, D is the delay factor between the signals as a linear factor relative to the sampling time, and $t_s$ is the sampling rate.

Therefore, under the assumption that the time shift is identical for both measured variables of a particular participant, of the named measured variables the following measured variables are available at sampling time k:

$$U_v(k), I_v(k), U_{Batt}(k+D*t_s), I_{Batt}(k+D*t_s)$$

For the determination of delay factor D, two designs can be distinguished. In the first design, for all signals of one of the participants a filtering is carried out that carries out a time shift by an initial factor D. The disadvantage of this design, compared to the following second design, is that only positive delays can be estimated and synchronized, and the signals of only one participant undergo the filter damping. Thus, it has to be known ahead of time which of the signals is advanced in order to make it possible to use the design.

Figure 4:
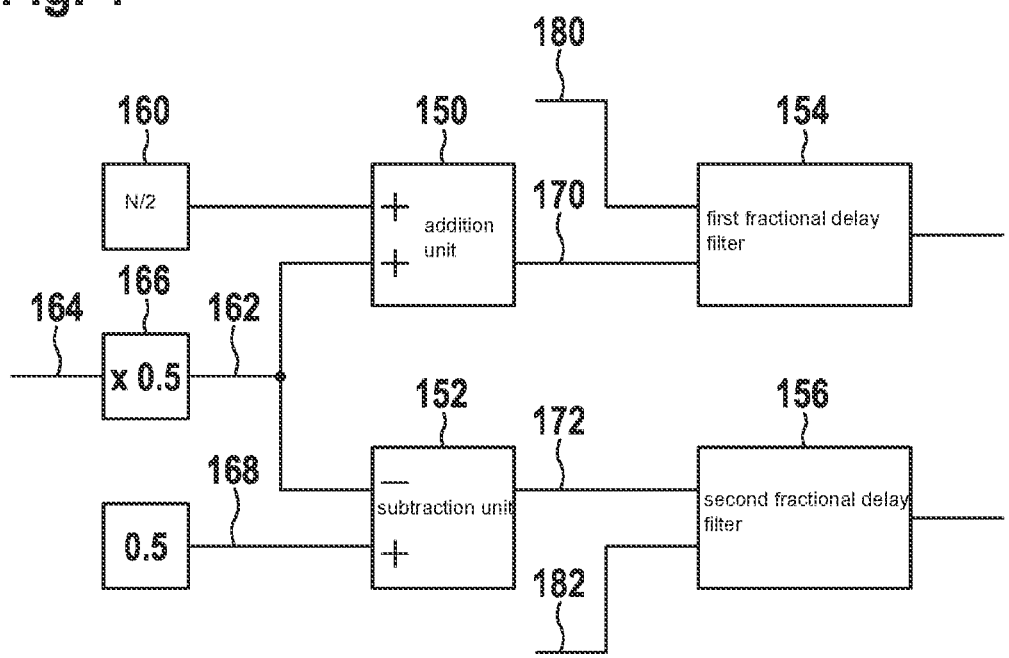
FIG. 4 shows a modeling of the paths before the filter.
Figure 5:
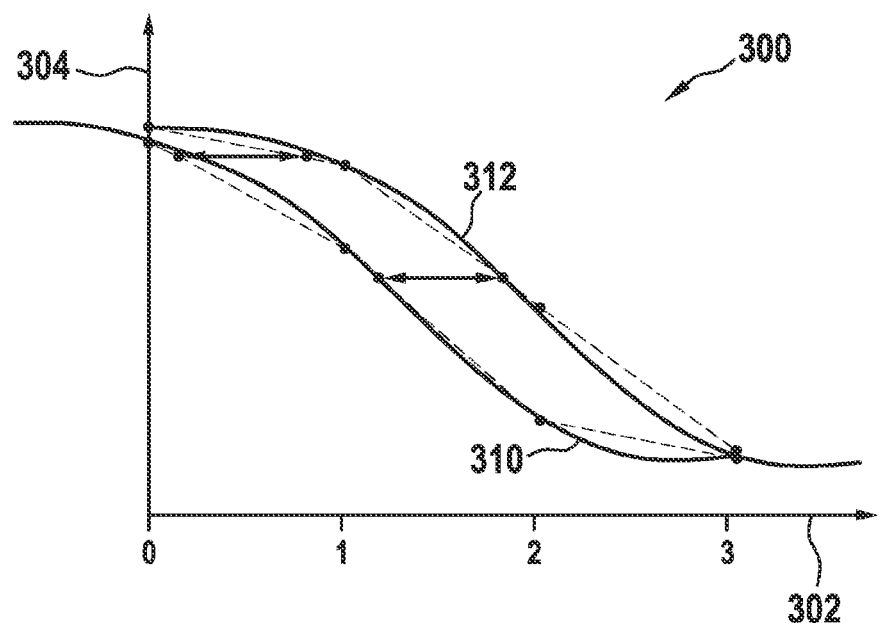
FIG. 5 shows, in a graph, the principle of functioning of a synchronization.

According to the second design, for the determination of delay factor D the input and measured variables u(k), z(k) of all participants are filtered, as shown in FIG. 4 and FIG. 5. Here, for the signals of participant 1 a time shift of N/2+D/2 is carried out, and for the signals of participant 2 a time shift of N/2−D/2 is carried out. The difference of the time shifts of the two participants thus yields the overall shift factor D. The time shift of the signals can be carried out using a so-called fractional delay filter.

In the following, the realization of the fractional delay filter is described by a first-order Lagrange filter (N=1). Higher-order Lagrange filters (N>1) are also possible, but then the filter coefficients are different.

$$u(k-D*t_s) = (u(k)*(1-D) + u(k-1)*D)$$

In this way, the estimated measurement variable $z(k-(½-D/2) t_s)$ and the estimated measured variable h $(k-(½+D/2) t_s)$ are calculated according to the procedure described above.

Here:

k: sampling time z: measured variable h: measured variable estimated from u via the model equation u: input variable (measured variable, not synchronous with measured variable z)

For the parameter estimation of the supply line and contact resistances of the cable harness, the already-calculated values for $z(k-(½-D/2) t_s)$ and $u(k-(½+D/2) t_s)$ can then be used. Alternatively, as shown in FIG. 2, using the calculated factor D 24 an additional filtering 14 having higher quality can be realized, for example a higher-order Lagrange filter, whose filtered variables are then provided to the parameter estimation. This has the advantage that, with a low computing expense for the estimation of factor D, a high signal quality of the delayed signals can be achieved. The method can also be set up using only Kalman filter 12, in which case the advantages named above are not present.

The synchronization is thus made up of two components: Kalman filter 12 for the estimation of the shift, and fractional delay filter 14 for the synchronization of the signals. The shift D is a linear factor that describes the time shift between the signals as $D*t_s$, where $t_s$ is the sample rate. The synchronized signals are then used by Kalman filter 16 to estimate the parameters, for example of a resistor.

For the synchronization of the signals of two subscribers, the relative shift $D*t_s$ to one another is the critical factor. In order to determine this shift and to enable the named advantages to be realized, a fractional delay filter, for example an n-order Lagrange filter, is newly modeled. On this, see FIG. 3.

Figure 3:
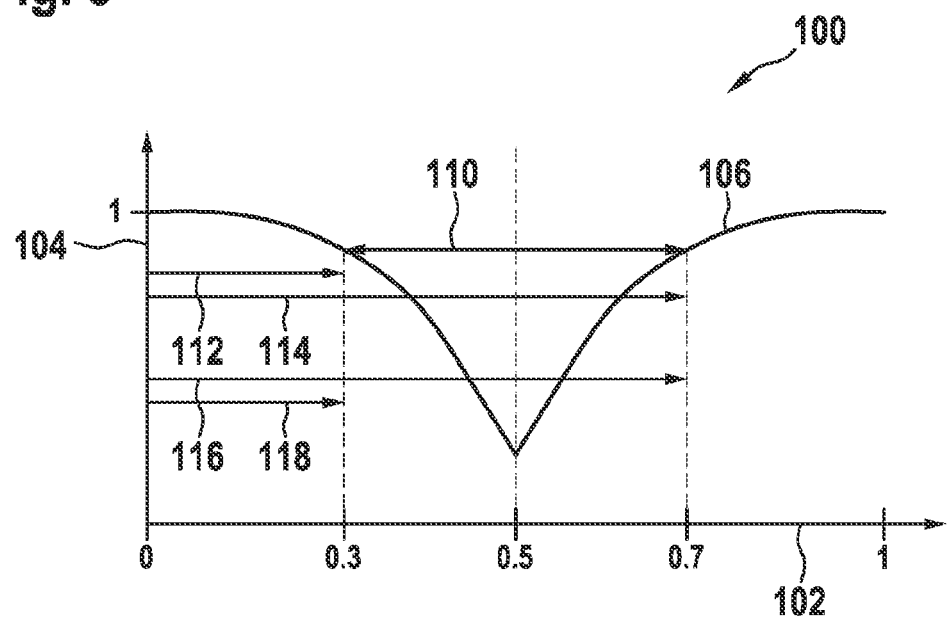
FIG. 3 shows a graph illustrating the filter characteristic.

FIG. 3 shows, in a graph 100 on whose abscissa 102 delay D is plotted and on whose ordinate 104 the damping |A| is plotted, the characteristic of a first-order filter, i.e. N=1, on the basis of a curve 106. A double arrow 110 indicates a ΔD of 0.4. A first arrow 112 indicates z(k−(0.5−D/2). A second arrow 114 indicates h(k−(0.5+D/2). A third arrow 116 indicates z(k−(0.5−D/2). A fourth arrow 118 indicates h(k−(0.5+D/2).

A D of 0.4 means that the signals of the first participant are advanced ahead of the signals of the second participant by $0.4*t_s$, where $t_s$ is equal to the sample time of the signals. A D of −0.4 means that the signals of the first participant run behind the signals of the second participant by $0.4*t_s$.

In the new modeling, the symmetry of the filter is used, which means that the damping |A| is equal for a delay of D and N−D. N corresponds here to the order of the filter. From this new modeling and the simultaneous filtering of the signals of the two participants, there result the two advantages, namely that an equal damping is achieved, and that both positive and negative delays are possible.

In the following, the filtering of the measured variables z(k) and of the estimated measured variables, calculated via the filtered input variables u(k) and the model equation h(k), are shown for the example of a first-order Lagrange filter (N=1):

$$z(k-(\tfrac{1}{2}-D/2)t_s)=z(k)(1-(\tfrac{1}{2}-D/2))+z(k-1)(\tfrac{1}{2}-D/2)$$

$$h(k-(\tfrac{1}{2}+D/2)t_s)=h(k)(1-(\tfrac{1}{2}+D/2))+h(k-1)(\tfrac{1}{2}+D/2)$$

If this measurement equation is implemented in a parameter estimator, then, using the noisy signals u(k) and z(k) and the model equation h(k), which is stated below, the delay D can be estimated.

$$D(k)=D(k-1)+[z(k-(\tfrac{1}{2}-D/2))-h(k-(\tfrac{1}{2}+D/2)t_s)]*[h(k-1-(\tfrac{1}{2}+D/2)t_s)-h(k-(\tfrac{1}{2}+D/2)t_s)]^{-1}$$

FIG. 4 shows, in a diagram, the modeling of the paths before the fractional delay filter (reference character 14 in FIG. 2). The representation shows an addition unit 150, a subtraction unit 152, a first fractional delay filter 154, and a second fractional delay filter 156. At the input of addition unit 150 there are provided the value N/2 160 and D/2 162, which results from a multiplication of the delay D 164 by a factor of 0.5 166. D/2 162 and a value N/2 168 are also provided at the input of subtraction unit 152.

Thus, the addition unit outputs N/2+D/2 170. Subtraction unit 152 outputs N/2−D/2 172. h(k) 180 and N/2+D/2 170 are inputted to first fractional delay filter 154. z(k) 182 and N/2−D/2 172 are inputted to second fractional delay filter 156. First fractional delay filter 154 outputs:

$$h(k-(N/2+D/2)*t_s)$$

Second fractional delay filter 156 outputs:

$$z(k-(N/2-D/2)*t_s)$$

The modeling of the shifts before fractional delay filters 154, 156 makes it possible to map positive and negative shifts between the components. Through the symmetry of fractional delay filters 154, 156, all signals undergo the same filter damping.

FIG. 5 shows, in a graph 300 on whose abscissa 302 k is plotted and on whose ordinate 304 the voltage U [V] is plotted, the principle of functioning of a synchronization as interpolation between two measured variables, represented by a first signal 310 and a second signal 312. These signals 310, 312 are asynchronous to one another. The relations of dependence of the measurements are given by a mathematical relationship, in this case $$U_1=U_2+I_2*R,$$

$$z(k)h(k)$$

where the left side of the equation is represented by first signal 310 and the right part of the equation is represented by second signal 312. The filtering now means an interpolation between measurement points that are identified by points in the Figure. The interpolations are illustrated by the straight lines in the Figure. Deviations in the mathematical relationship are then corrected by shifting the measurements. The interpolation of the measured variables of the two components, namely $U_1$, $U_2$, $I_2$, enables the signal shift. Here there take place a shift of the interpolated measurement variables ($U_1$) of the first component by the factor D/2+N/2 and a shift of the interpolated measurement variables ($U_2$, $I_2$) of the second component by the factor N/2−D/2.

Figure 6:
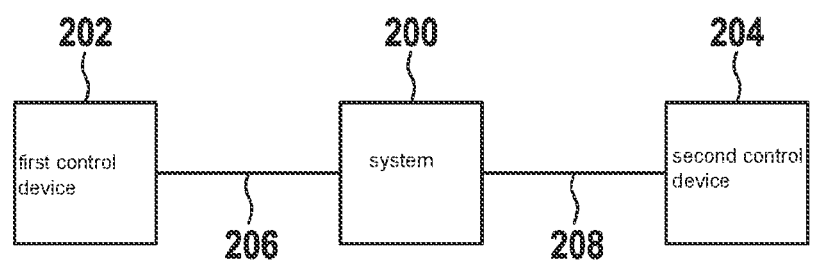
FIG. 6 shows, in a schematic representation, a system for carrying out the method in accordance with an example embodiment of the present invention.

FIG. 6 shows, in a schematic, highly simplified representation, a system for carrying out the method, designated as a whole by reference character 200. In this case, this system 200 is fashioned as a control device of a vehicle.

System 200 is connected to a first participant, or control device 202, and to a second participant, or control device 204, first control device 202 sending a first signal 206 to system 200, and second control device 204 sending a second signal 208 to system 200. The two signals 206, 208, which each carry measured values as information, are to be combined for evaluation in system 200; here it is to be kept in mind that the two signals 206, 208 are asynchronous to one another. In system 200, using the method presented herein a synchronization of the two signals 206, 208 can now be carried out, so that subsequently an evaluation of signals 206, 208 can be carried out, in this embodiment also in system 200.

Of course, the method can also be carried out with more than two participants or control devices. Here, the control devices can be synchronized with one another. However, a synchronization can also be carried out between one or more control devices and system 200.

The method can be applied in many ways if the following requirements are met:

The signals of the participants must have a mathematical relation.

The signals of the participants must have the same sampling rate, which can be resolved by a resampling filter.

What is claimed is:

1. A method for synchronizing signals of at least one participant of a decentralized system of an onboard electrical or energy network of a vehicle, a relationship between the signals being given by a mathematical relation, the method comprising the following steps:
   filtering each of the signals with a first filter to determine a shift between the signals, the determined shift being a measure of a phase shift between the signals; and
   eliminating the determined shift by filtering the signals with a second filter,
   wherein a symmetry of the first filter and the second filter is used to determine and to eliminate both a positive shift and a negative shift.

2. The method as recited in claim 1, wherein the first filter is a Kalman filter, a measurement equation being realized as a first-order fractional delay filter.

3. The method as recited in claim 2, wherein the first-order fractional delay filter is a Lagrange filter.

4. The method as recited in claim 1, wherein a Kalman filter for estimating the shift and a Lagrange filter for synchronizing the signals are combined in one filter.

5. The method as recited in claim 4, wherein after the synchronization of the signals, an estimation of at least one parameter is carried out based on the synchronized signals.

6. The method as recited in claim 5, wherein the at least one parameter is estimated with another Kalman filter.

7. The method as recited in claim 1, wherein the method is carried out in the onboard electrical network of the vehicle.

8. The method as recited in claim 1, wherein the signals have different sampling rates, and the signals are treated with a resampling filter.

9. A decentralized system of an onboard electrical or energy network of a vehicle for synchronizing signals of a plurality of participants, a relationship between the signals being given by a mathematical relation, the system configured to:
> filter each of the signals with a first filter to determine a shift between the signals, the determined shift being a measure of a phase shift between the signals; and
> eliminate the determined shift by filtering the signals with a second filter,
> wherein a symmetry of the first filter and the second filter is used to determine and to eliminate both a positive shift and a negative shift.

10. The decentralized system as recited in claim 9, wherein the system is a control device of the vehicle.

11. A non-transitory machine-readable storage medium on which is stored a computer program for synchronizing signals of at least one participant, a relationship between the signals being given by a mathematical relation, the computer program, when executed by a computer, causing the computer to perform the following steps:
> filtering each of the signals with a first filter to determine a shift between the signals, the determined shift being a measure of a phase shift between the signals; and
> eliminating the determined shift by filtering the signals with a second filter,
> wherein a symmetry of the first filter and the second filter is used to determine and to eliminate both a positive shift and a negative shift.

* * * * *